United States Patent
Pawel et al.

(10) Patent No.: US 7,417,880 B2
(45) Date of Patent: Aug. 26, 2008

(54) CIRCUIT CONFIGURATION WITH ERROR DETECTION FOR THE ACTUATION OF POWER SEMICONDUCTOR SWITCHES AND ASSOCIATED METHOD

(75) Inventors: Sacha Pawel, Gotha (DE); Reinhard Herzer, Llmenau (DE); Llja Pawel, Gotha (DE)

(73) Assignee: Semikron Elektronik GmbH & Co. KG, Nuremberg (DE)

( * ) Notice: Subject to any disclaimer, the term of this patent is extended or adjusted under 35 U.S.C. 154(b) by 336 days.

(21) Appl. No.: 11/439,785

(22) Filed: May 23, 2006

(65) Prior Publication Data

US 2006/0268588 A1   Nov. 30, 2006

(30) Foreign Application Priority Data

May 23, 2005  (DE) ........................ 10 2005 023 652

(51) Int. Cl.
  *H02M 7/5387* (2007.01)
(52) U.S. Cl. ...................... 363/132; 363/56.2
(58) Field of Classification Search ............... 363/56.2, 363/56.3, 98, 132; 307/115, 139, 140; 327/333, 327/448
See application file for complete search history.

(56) References Cited

U.S. PATENT DOCUMENTS

| | | | |
|---|---|---|---|
| 6,847,174 B2 * | 1/2005 | Franck | 315/209 R |
| 7,233,510 B2 * | 6/2007 | Pawel et al. | 363/132 |
| 2003/0112040 A1 | 6/2003 | Yoshimura | |
| 2006/0087260 A1 * | 4/2006 | Herzer et al. | 315/291 |

* cited by examiner

*Primary Examiner*—Jessica Han
(74) *Attorney, Agent, or Firm*—Lackenbach Siegel, LLP; Andrew Young, Esq.

(57) ABSTRACT

An integrated circuit configuration is provided comprising a primary side and a secondary side, for actuating power switches disposed in bridge circuit topology as well as an associated method. The primary side comprises a signal processing means and a level shifter for the potential-free actuation of the secondary side. The secondary side, in turn, comprises a signal processing means as well as a driver stage for the TOP switch. For the detection of the switched state of the TOP switch on the primary side, this side comprises a circuit section for the detection and interpretation of a current flow through a level shifter. A first lower threshold value of this current through the level shifter detected on the primary side is assigned to the not-switched-on TOP switch of the bridge circuit, and a second upper threshold value of this current through the level shifter detected on the primary side is assigned to the switched-on TOP switch of the bridge circuit.

8 Claims, 3 Drawing Sheets

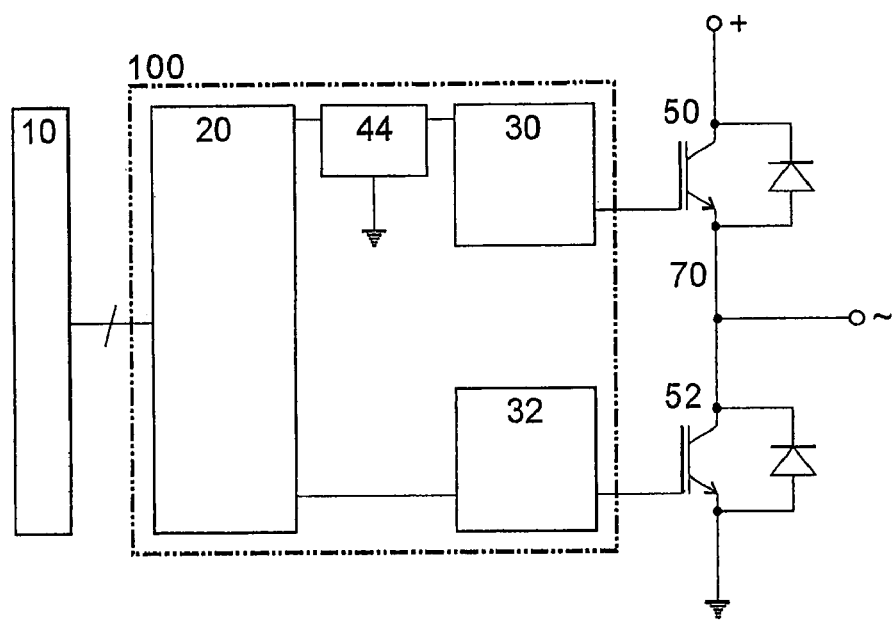
(PRIOR ART) Fig. 1
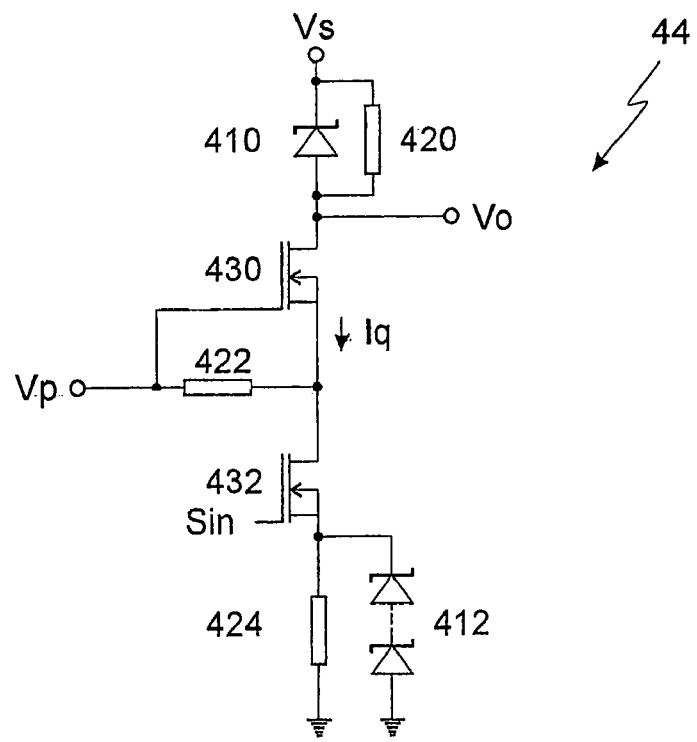
(PRIOR ART) Fig. 2

CIRCUIT CONFIGURATION WITH ERROR DETECTION FOR THE ACTUATION OF POWER SEMICONDUCTOR SWITCHES AND ASSOCIATED METHOD

CROSS REFERENCE TO RELATED APPLICATIONS

This application claims priority from DE Patent App. No. DE 10 205 023 652.9 filed May 23, 2005, the entire contents of which are herein fully incorporated by reference.

BACKGROUND OF THE INVENTION

1. Field of the Invention

The present invention relates to a preferably integrated circuit configuration for the actuation of power switches disposed in bridge circuit topology as well as an associated method. More specifically, the present invention relates to a circuit configuration wherein, such bridge configurations of power switches are semi-, H- (two-phase), or as three-phase bridge circuits, the single phase semibridge representing the basic module of such electronic power circuits. In this configuration a semibridge circuit, two power switches, a first, so-called TOP switch, and a second, so-called BOT switch, are connected in series. Preferably, such a semibridge is connected to a direct current link and the center tapping is typically connected to a load.

2. Description of the Related Art

The related art involves a circuit configuration wherein when the power switches are implemented as a power semiconductor component or as a multiplicity of identical series- or parallel-connected power semiconductor components, an actuation circuit is necessary for the actuation of the power switches. Within the related art such actuation circuits are comprised of several subcircuits or function blocks. The actuation signal from a superordinate control is processed in a first subcircuit of a primary side, and, via further components, supplied to the driver circuits, the secondary sides and lastly to the control input of the particular power switch.

In semibridge configurations with higher link voltages, for example greater than 50 V, the primary side, in potential/ electrical terms, is isolated from the secondary side for the processing of the control signals, since the power switches, at least the TOP switch of the semibridge, during operation are not at a constant potential and consequently the isolation in terms of voltage is unavoidable.

This isolation, according to related art takes place for example by means of isolating transformers, optocouplers, for example optical wave guides. This electrical isolation, is at least carried out for the TOP switch, but at higher powers also for the BOT switch due to a possible breaking of the ground reference potential during the switching.

Also known are integrated circuit configurations for power switches of voltage classes up to 600 V or 1200 V, which forgo the use of external electrical isolation. In these monolithically integrated circuits, according to related art, so-called level shifters are utilized, at least for the TOP switch. These electronic components and techniques for isolation consequently overcome the potential difference of the primary side with respect to the secondary side.

As background, and referring now to FIGS. 1 and 2, in the actuation of power semiconductor components 50, 52, such as for example IGBTs (Insulated Gate Bipolar Transistor) with antiparallel connected free-wheeling diode, in a circuit configuration in bridge topology, due to the voltage difference between superordinate control 10, for example in the form of a microcontroller 10, and the primary side 20 of the circuit configuration on the one hand, and the secondary side 30, 32 of the circuit configuration and the power semiconductor component 50, 52 on the other hand, a detrimental isolation of the potential is required. According to prior art, various feasibilities for potential isolation are known, for example transformers, optocouplers, optical wave guides or electronic components with appropriate electrical strength.

Specifically in FIG. 1, in the monolithic integration of primary side 20 and secondary side 30 of a circuit configuration 100 for actuating power semiconductor switches 50, 52, level shifters 44 are frequently utilized for the transmission of control signals from the primary side 20 to the secondary side.

With the components for the potential isolation, switch-on and switch-off signals can be transmitted from the primary side 20, (low voltage side) to the secondary side 30, (high voltage side). However, essential for the trouble-free operation of an electronic power system is the primary-side information about operating states of the secondary side 30, for example information about the concrete switched states of the TOP and of the BOT switch.

Specifically in FIG. 2, shown is a known topology of a monolithically integrated level shifter, here with an nMOS high-voltage transistor 430 with a blocking capacity corresponding to the maximal potential difference between primary 20 and secondary side 30. The actuation of the secondary side takes place from the primary side. As soon as the primary side 20 switches on the high-voltage transistor 430, a cross current (lq) flows between the supply voltage (Vs) of the secondary side and the ground reference potential of the primary side 20. This current flow (lq) is detected on the secondary side and converted into a signal to be processed further.

The level shifter 44 is controlled through the input signal (Sin). For this purpose, this signal is preferably preamplified and applied at the control input of a low-voltage transistor 432. As long as this low-voltage transistor 432 is open, the potential of the supply voltage (Vp) of the primary side is connected to the "source" of the high-voltage transistor 430. Since the "gate" of the high-voltage transistor 430 is also connected to the supply voltage (Vp) of the primary side 20, the entire offset voltage between primary side and secondary side falls across the high-voltage transistor 430. If the low-voltage transistor 432 is switched on, the potential at the source of the high-voltage transistor 430 falls and a cross current (lq) starts to flow. However, this current is limited by the counter-coupling resistor 424. The cross current (lq) consequently conveys the switching signal of the primary side to the secondary side thereby that here the voltage drop across the resistor 420 is interpreted. In the stationary state, in the presence of an input signal (Sin) "low", this circuit does not consume any energy with the exception of the negligible leakage current of the high-voltage transistor 430. The signal deviation on the secondary side is limited through the Zener diode 410. Together with the resistor 424, the primary-side series connection of Zener diodes 412 protects the low-voltage transistor 432 against loading by transient overvoltages.

Due to the clamping on the secondary side and the current limitation across emitter counter coupling, the cross current (lq) during the switch-on pulse at the high-voltage transistor 430 varies with the offset voltage. The saturation behavior of the high-voltage transistor is reflected in the drain current values over the offset voltage (see for example FIG. 4).

The total voltage (cf. (Ug) in FIG. 4) results from the potential difference between the primary-side ground reference potential and the secondary-side voltage supply (Vs).

Consequently, this corresponds to the sum of the offset voltage between primary and secondary side and the secondary-side operating voltage.

What is not appreciated by the related art is that in this described form of the integrated circuit configuration for actuating power switches no possibility exists, including in the simplest configuration for the secondary side of the TOP switch, for error feedback to the primary side.

Accordingly, there is a need for an improved and a preferably monolithically integrated circuit configuration for power semiconductor switches in bridge configuration as well as an associated method, which permits a primary side detection of the switched state of at least one power semiconductor switch of a secondary side by means of simple and integratable means.

OBJECTS AND SUMMARY OF THE INVENTION

An object of the present invention is to provide circuit and method that overcomes one of the detriments or responds to one of the needs noted above.

According to another object of the present invention there is provided an inventive concept that builds on a related circuit configuration for actuating power semiconductor switches in bridge topology comprised of a primary-side section (primary side) and for each power semiconductor (component) switch a secondary-side section (secondary side), wherein the bridge circuit comprises a first, the TOP switch, and a second, the BOT switch. These switches are connected in a conventional manner to a DC link. The center tapping between the TOP and the BOT switch forms the AC output of the bridge circuit. The circuit configuration for the actuation comprises on its primary side at least one signal processing means as well as at least one level shifter for the potential-free actuation of the at least one secondary side. This secondary side, in turn, comprises at least one signal processing means as well as at least one driver stage for the particular switch.

According to another object of the present invention there is provided a preferably monolithically integrated circuit configuration for actuating power semiconductor switches, wherein for the conveyance of the switched state of the semiconductor switch from the secondary side to the primary side an already present level shifter is utilized, which serves for the transmission of actuation signals from the primary side to the secondary side. On the primary side at least is disposed one circuit section for the detection and interpretation of a current flow through at least one level shifter assigned to the power semiconductor switch which is to be monitored.

According to another object of the present invention there is provided an associated method serving for the primary-side detection of the switched state of a secondary-side actuated power semiconductor switch. For this purpose the current flow through the level shifter is interpreted on the primary-side. A first lower threshold value of this current through the level shifter, detected on the primary side, corresponds to a non-switched-on switch of the bridge circuit, whereas a second upper threshold value of this current through the level shifter, detected on the primary side, corresponds to a switched-on switch of the bridge circuit.

The present invention also relates to an integrated circuit configuration comprising a primary side and a secondary side, for actuating power switches disposed in bridge circuit topology as well as an associated method. The primary side comprises a signal processing means and a level shifter for the potential-free actuation of the secondary side. The secondary side, in turn, comprises a signal processing means as well as a driver stage for the TOP switch. For the detection of the switched state of the TOP switch on the primary side, this side comprises a circuit section for the detection and interpretation of a current flow through a level shifter. A first lower threshold value of this current through the level shifter detected on the primary side is assigned to the not-switched-on TOP switch of the bridge circuit, and a second upper threshold value of this current through the level shifter detected on the primary side is assigned to the switched-on TOP switch of the bridge circuit.

According to an embodiment of the present invention there is provided an integrated circuit configuration 100 for actuating at least a first (TOP) and a second (BOT) respective power semiconductor switches 50, 52 in a bridge topology, the circuit configuration comprising: a primary-side section (primary side, 20 and at least one respective secondary side section (secondary side, 30 for respective power semiconductor switches 50, 52 in the bridge topology, the primary-side section circuitry 20 further comprising: at least one means for signal processing and at least one assigned level shifter 44 for enabling a potential-free actuation of the at least one secondary side 30, the secondary side section circuitry 30, further comprising: at least one means for signal processing, at least one driver stage for the respective power semiconductor switch in the bridge topology, means for detecting a switched state of the at least one power semiconductor switch 50, on the primary side section 20, and the means for detecting including at least one additional circuit section 46, 47, 48 enabling a detection and an interpretation of a current flow (lq) through an assigned level shifter 44.

According to another embodiment of the present invention there is provided an circuit configuration, wherein: the at least one additional circuit section for the means for detecting including at least one of a means for current-acquisition, a means for voltage acquisition, and a means for current-limitation.

According to another embodiment of the present invention there is provided a circuit configuration, wherein: in circuit connection, the assigned level shifter 44, further comprises: one secondary-side voltage supply (Vs), at least one Zener diode 410, a secondary-side output (Vo), a high-voltage transistor 430, a primary-side voltage supply (Vp), and a low-voltage transistor 432.

According to another embodiment of the present invention there is provided an circuit configuration, wherein the level shifter 44 following the voltage supply on the secondary side section 30, following the voltage supply on this side, further comprising: at least one series connection of Zener diodes 414.

According to another embodiment of the present invention there is provided a circuit configuration, further comprising: a medium-voltage transistor 434 disposed in parallel with at least one series connection of Zener diodes 414a/b.

According to another embodiment of the present invention there is provided a method for detecting a switched state of a power semiconductor switch 50 in a circuit configuration 100 for actuating at least a first (TOP) and a second (BOT) respective power semiconductor switches 50, 52 in a bridge topology, comprising the steps of: interpreting a current flow (lq) through a level shifter 44 on a primary side section 20 by means of at least one circuit section, the at least one circuit section being one of a means for current acquisition, means for voltage acquisition, and a means for current limitation, the step of interpreting further comprising the steps of: detecting a first lower threshold value (I1) of the current flow (lq) through the level shifter 44 on the primary side section, the first lower threshold value (I1) being a corresponding not-switched-on state of one of the power semiconductor switches of the bridge topology, detecting a second upper threshold value (I2) of the current flow (Iq) through the level shifter 44 on the primary side section 20, and the second upper threshold value (I2) being a corresponding to a switched-on switch state of the one of the power semiconductor switches of the bridge topology.

According to another embodiment of the present invention there is provided a method for detecting, according to claim 6, further comprising the step of: detecting the current flow (Iq) through the level shifter 44 by means of at least one means for current acquisition 46 and at least one means for voltage-acquisition, whereby the method readily enables error detection of the power semiconductor switches.

According to another embodiment of the present invention there is provided a method for detecting, further comprising the step of: providing a means for current limitation 48 on said primary side section, thereby preventing an overloading of said level shifter 44.

The above, and other objects, features and advantages of the present invention will become apparent from the following description read in conduction with the accompanying drawings, in which like reference numerals designate the same elements.

BRIEF DESCRIPTION OF THE DRAWINGS

FIG. 1 provides a circuit configuration according to the related art.

FIG. 2 provides a level shifter configuration according to the related art.

DETAILED DESCRIPTION OF THE PREFERRED EMBODIMENTS

Figure 3:
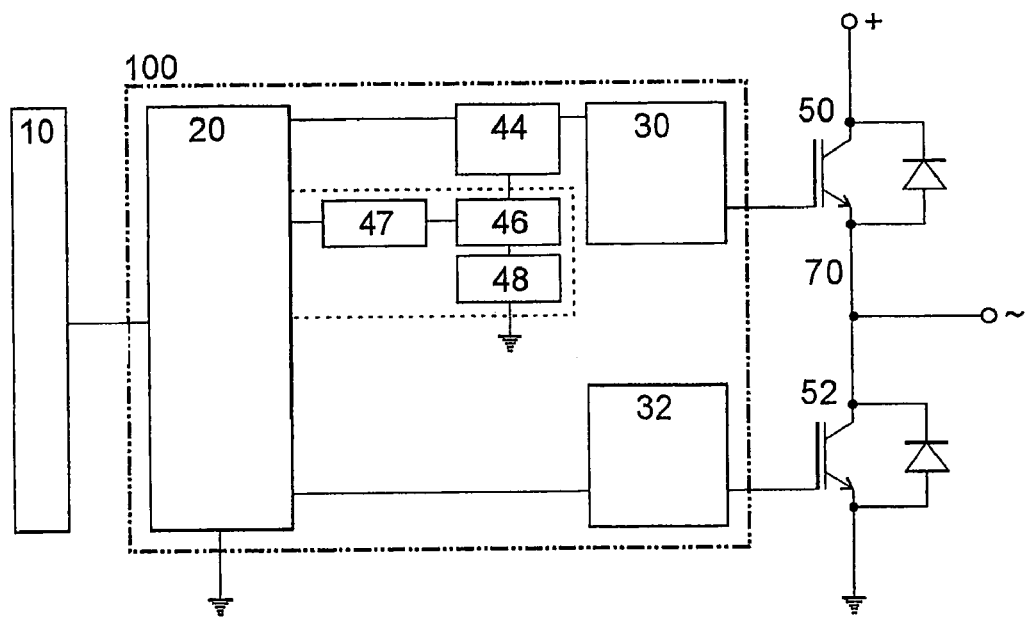
FIG. 3 provides a circuit configuration further developed according to one aspect of the present invention.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Referring now to FIG. 3, a monolithically integrated circuit configuration 100 further developed according to the invention, which can, however, also be realized as a hybrid circuit configuration in the same manner. In a further development according to the invention the level shifter 44 on the primary side 20 is supplemented by a current-acquisition means 46 and a voltage-acquisition means 47, as well as by a current limitation 48. Depending on the total voltage (Ug) the cross current (Iq) is set up and determinable. The latter is determined via the current-acquisition means 46 and converted into a utilizable signal by means of the voltage-acquisition means 47. The current limiter 48 serves for limiting the loading of the high-voltage transistor as well as for limiting the current consumption of the level shifter 44.

The power semiconductor switches 50, 52 of the bridge configuration are utilized in switching operation, i.e. they are alternately switched on and off. The center tapping (output) of the bridge consequently has only two stationary states. If the TOP switch 50 is switched on while the BOT switch 52 switched off, the center tapping is in the proximity of the direct current link voltage; if the TOP switch 50 is switched off and the BOT switch 52 switched on, the center tapping is in the proximity of the ground reference potential. For the detection of the switched state of the TOP switch 50 therefore, only the magnitude of the cross current (Iq) of the level shifter 44 on the primary side 20 needs to be acquired, which is set up as a function of the magnitude of the total voltage (Ug).

When a switch-on pulse is transmitted from the primary side 20 to the secondary side 30 across the level shifter 44, the cross current (Iq) depends herein on the total voltage (Ug). And the switched-on TOP switch 50 is accompanied by an increase of the total voltage. Due to the described characteristic of the level shifter 44, this increase of the total voltage corresponds to an increase of the cross current Iq.

Figure 4:
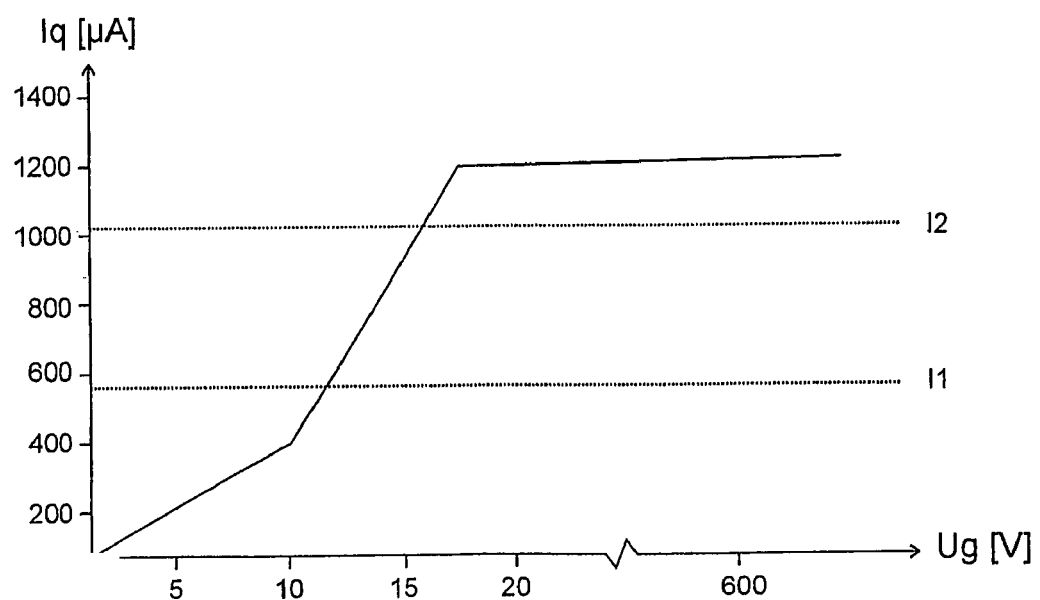
FIG. 4 provides the relationship between the current flow through the level shifter and the threshold value formation for understanding.

Referring now to FIG. 4 the relationship schematically from the aspect of the detection circuit on the primary side is shown. Here an increase of the cross current (Iq) is determined via a second threshold value (I2) and interpreted as a consequence of the switching-on of the TOP switch. In comparison, the non-attainment (falling below) of a first threshold value (I1) is interpreted as the not-switched-on state of the TOP switch. Between the first threshold value and the second threshold value is a current difference to be defined suitable to the circuit for the correct detection of the switched states. Through the primary-side measurement of the cross current (Iq) it is consequently possible to determine with certainty whether or not the secondary-side switch has been switched on as a consequence of the transmitted switch-on signal.

Figure 5:
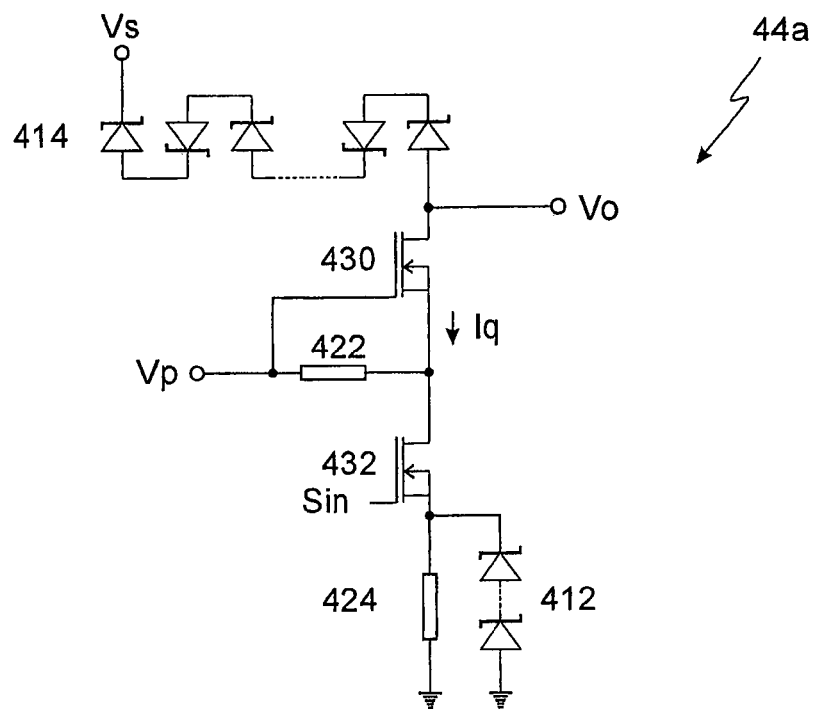
FIG. 5 provides an additional, further developed embodiment of a level shifter for disposition in a circuit configuration according to another embodiment of the present invention.

Referring now to FIG. 5, a first, further developed alternative embodiment of a level shifter 44a for disposition in a circuit configuration according to the invention. For simplification of the cross current (Iq) detection, the threshold values can be shifted. For this purpose the secondary-side of the level shifter 44a is modified by a shift of the potential. The series connection of Zener diodes 414 replaces herein the individual Zener diodes 410 and the resistor 420 from FIG. 2 connected in parallel. This disposition in operation shifts the saturation value of the cross current (Iq) with respect to the total voltage (Ug) and leads importantly to a symmetric transfer characteristic. This means that the steepness (or slope) of the current-voltage change in the range this side of the first threshold (I1, in FIG. 4 and the other side of the second threshold (I2) is shaped approximately identical. The advantage of this embodiment of the level shifter 44a is that even during a time period in which the assigned switch is already assumed to be switched on, a function check can consequently be performed through a further switch-on pulse. In this case also an interpretation of the cross current (Iq) yields a feedback regarding the switched state of the TOP switch. With this feedback, error conditions of the secondary side, for example switch-off due to undervoltage errors, can be conveyed indirectly to the primary side and therewith to the superordinate control.

Figure 6:
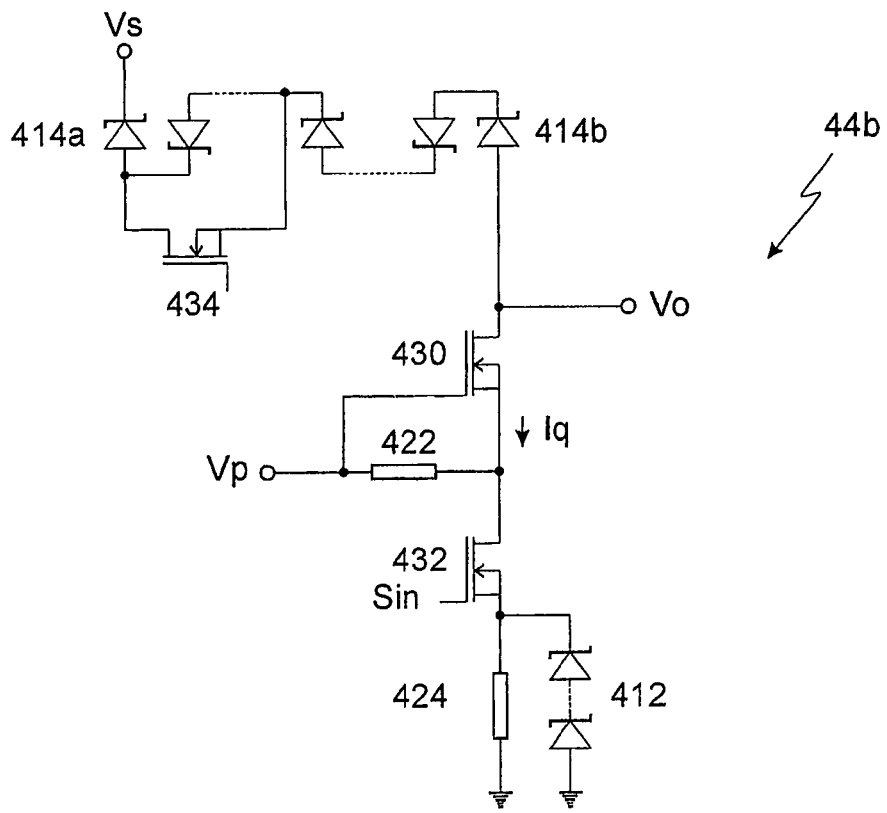
FIG. 6 provides an alternative developed embodiment of a level shifter for disposition in a circuit configuration according to another aspect of the present invention.

Referring now to FIG. 6, a second, further developed alternative embodiment of a level shifter 44b for the disposition in a circuit configuration according to the invention, which is based on the level shifter 44a according to FIG. 5. Of disadvantage in this alternative embodiment (according to FIG. 5)

is that here an error transmission can exclusively (only) be initiated by the primary side, however the secondary side is not capable of actively conveying an error to the primary side. To make this possible, the series connection 414 of the Zener diodes on the secondary side is developed further such that in parallel with a plurality of these Zener diodes 414a a medium voltage transistor 434 is connected, which must have greater electric strength than the sum of the voltages of the Zener diodes 414a. The remaining Zener diodes 414b are not affected by this modification. Of advantage herein is that, specifically in the case of monolithic integration, such medium voltage transistors 434 have lower area requirement than high-voltage transistors 432 and consequently can be integrated into the circuit configuration in technologically simpler ways, saving more space and more cost-effectively than a dedicated path for feedbacks across high-voltage transistors from the secondary side to the primary side.

In the case of a medium voltage transistor 434 actuated from the secondary side and switched off in normal operation, the behavior of the level shifter 44b is identical to that of FIG. 5, i.e. only in the actuation phase of the level shifter flows a significant cross current (Iq). In any error case, the secondary side can actively switch on this medium voltage transistor and consequently initiate a cross current flow. This flow is detected on the primary side and identified as an error signal from the secondary to the primary side.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

The invention claimed is:

1. A integrated circuit configuration for actuating at least a first (TOP) and a second (BOT) respective power semiconductor switches in a bridge topology, said circuit configuration comprising:
    a primary-side section and at least one respective secondary side section for respective power semiconductor switches in said bridge topology;
    said primary-side section circuitry further comprising:
        at least one means for signal processing and at least one assigned level shifter for enabling a potential-free actuation of said at least one secondary side;
    said secondary side section circuitry, further comprising:
        at least one means for signal processing;
        at least one driver stage for said respective power semiconductor switch in said bridge topology;
        means for detecting a switched state of said at least one power semiconductor switch, on said primary side section; and
        said means for detecting including at least one additional circuit section enabling a detection and an interpretation of a current flow (Iq) through said assigned level shifter.

2. A circuit configuration, according to claim 1, wherein:
    said at least one additional circuit section for said means for detecting includes at least one of a means for current-acquisition, a means for voltage acquisition, and a means for current-limitation.

3. A circuit configuration, according to claim 1, wherein in circuit connection, said assigned level shifter, further comprises:
    one secondary-side voltage supply (Vs);
    at least one Zener diode;
    a secondary-side output (Vo);
    a high-voltage transistor;
    a primary-side voltage supply (Vp); and
    a low-voltage transistor.

4. A circuit configuration, according to claim 3, wherein:
    said level shifter following said voltage supply on said secondary side section, following the voltage supply on this side, further comprising:
    at least one series connection of Zener diodes.

5. A circuit configuration, according to claim 4, further comprising:
    a medium-voltage transistor disposed in parallel with said at least one series connection of Zener diodes.

6. Method for detecting a switched state of a power semiconductor switch in a circuit configuration for actuating at least a first (TOP) and a second (BOT) respective power semiconductor switches in a bridge topology, comprising the steps of:
    interpreting a current flow (Iq) through a level shifter on a primary side section by means of at least one circuit section;
    said at least one circuit section being one of a means for current acquisition, means for voltage acquisition, and a means for current limitation;
    said step of interpreting further comprising the steps of:
        detecting a first lower threshold value (I1) of said current flow (Iq) through said level shifter on said primary side section;
        said first lower threshold value (I1) being a corresponding not-switched-on state of one of said power semiconductor switches of said bridge topology;
        detecting a second upper threshold value (I2) of said current flow (Iq) through said level shifter on said primary side section; and
        said second upper threshold value (I2) being a corresponding to a switched-on switch state of said one of said power semiconductor switches of said bridge topology.

7. A method for detecting, according to claim 6, further comprising the step of:
    detecting said current flow (Iq) through said level shifter by means of at least one means for current acquisition and at least one means for voltage-acquisition, whereby said method readily enables error detection of said power semiconductor switches.

8. A method for detecting, according to claim 6, further comprising the step of:
    providing a means for current limitation on said primary side section, thereby preventing an overloading of said level shifter.

* * * * *